(12) United States Patent
Jung

(10) Patent No.: US 9,342,644 B1
(45) Date of Patent: May 17, 2016

(54) SEMICONDUCTOR INTEGRATED CIRCUIT HAVING DIFFERENTIAL AMPLIFIER AND METHOD OF ARRANGING THE SAME

(71) Applicant: SK hynix Inc., Icheon-si Gyeonggi-do (KR)

(72) Inventor: Huk Min Jung, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 14/992,233

(22) Filed: Jan. 11, 2016

Related U.S. Application Data

(62) Division of application No. 13/972,039, filed on Aug. 21, 2013, now Pat. No. 9,263,427.

(30) Foreign Application Priority Data

Apr. 29, 2013 (KR) .......................... 10-2013-0047250

(51) Int. Cl.
*H01L 21/335* (2006.01)
*H01L 21/77* (2006.01)
*G06F 17/50* (2006.01)
*H01L 27/088* (2006.01)
*H01L 27/02* (2006.01)

(52) U.S. Cl.
CPC ........ *G06F 17/5072* (2013.01); *H01L 27/0207* (2013.01); *H01L 27/088* (2013.01)

(58) Field of Classification Search
CPC .............. H01L 27/0207; H01L 27/088; G01F 17/5072
USPC ........................................................ 438/129
See application file for complete search history.

(56) References Cited

U.S. PATENT DOCUMENTS

| | | | | |
|---|---|---|---|---|
| 6,552,402 B1 * | 4/2003 | Ozasa | .................... | H01L 27/088 257/206 |
| 7,307,294 B2 * | 12/2007 | Aggarwal | ........... | H01L 27/0207 257/202 |
| 8,258,552 B2 * | 9/2012 | Becker | ................ | H01L 27/0207 257/206 |
| 8,264,008 B2 * | 9/2012 | Becker | ................ | H01L 27/0207 257/206 |
| 8,264,009 B2 * | 9/2012 | Becker | ................ | H01L 27/0207 257/206 |
| 8,350,339 B2 * | 1/2013 | Huang | ............ | H01L 21/823425 257/401 |
| 8,470,674 B2 * | 6/2013 | Anderson | ....... | H01L 21/823412 257/206 |
| 8,723,273 B2 * | 5/2014 | Huang | ............ | H01L 21/823425 257/401 |
| 8,823,062 B2 * | 9/2014 | Becker | ................ | H01L 27/0207 257/206 |
| 8,921,896 B2 * | 12/2014 | Becker | ................ | H01L 27/0207 257/206 |
| 8,921,897 B2 * | 12/2014 | Becker | ................ | H01L 27/0207 257/206 |
| 8,946,781 B2 * | 2/2015 | Becker | ................ | H01L 27/0207 257/206 |
| 8,952,425 B2 * | 2/2015 | Becker | ................ | H01L 27/0207 257/206 |

(Continued)

*Primary Examiner* — Earl Taylor
(74) *Attorney, Agent, or Firm* — William Park & Associates Ltd.

(57) ABSTRACT

A semiconductor integrated circuit comprises: a transistor region having a center line; a first block arranged in one side of the center line of the transistor region, and comprising a plurality of first and second groups each having a plurality of first and second segment transistors constituting first and second transistors of a differential amplifier; and a second block arranged in the other side of the center line, and having an arrangement corresponding to the arrangement of the first and second groups of the first block.

3 Claims, 4 Drawing Sheets

(56) References Cited

U.S. PATENT DOCUMENTS

| | | | |
|---|---|---|---|
| 2006/0026547 A1* | 2/2006 | Aggarwal | H01L 27/0207 257/202 |
| 2008/0022247 A1* | 1/2008 | Kojima | G06F 17/5072 257/401 |
| 2010/0133589 A1* | 6/2010 | Aruga | H01L 27/0207 257/206 |
| 2010/0155956 A1* | 6/2010 | Werkheiser | H01L 21/76819 257/773 |
| 2011/0298059 A1* | 12/2011 | Huang | H01L 21/823425 257/401 |
| 2013/0093028 A1* | 4/2013 | Huang | H01L 21/823425 257/401 |
| 2014/0319647 A1* | 10/2014 | Jung | H01L 27/088 257/499 |

\* cited by examiner

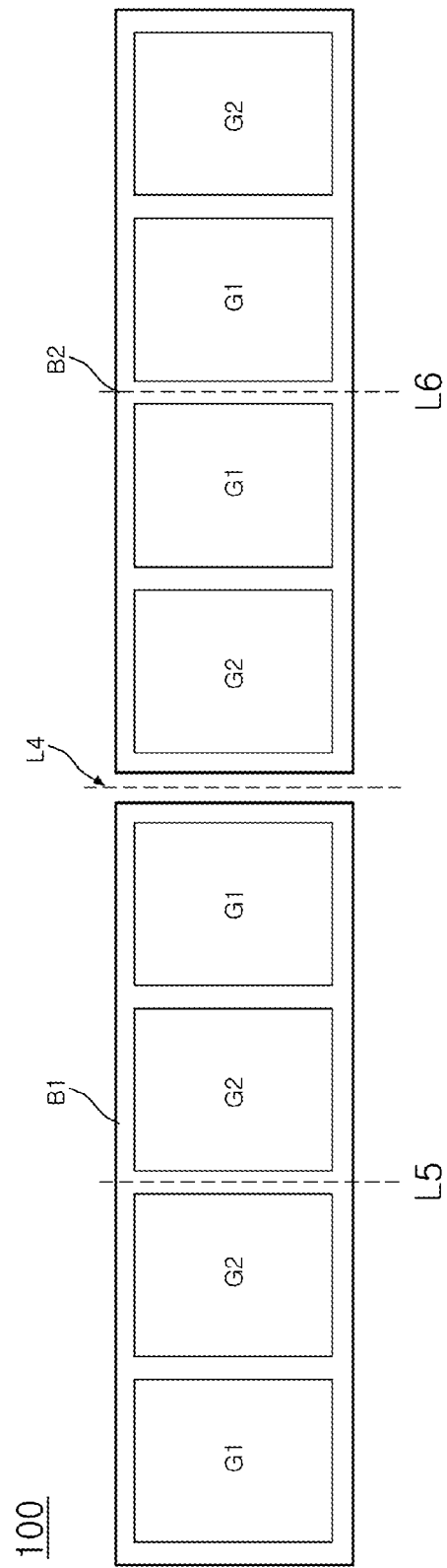

SEMICONDUCTOR INTEGRATED CIRCUIT HAVING DIFFERENTIAL AMPLIFIER AND METHOD OF ARRANGING THE SAME

CROSS-REFERENCES TO RELATED APPLICATION

The present application is a Division of U.S. application Ser. No. 13/972,039, filed on Aug. 21, 2013, and the present application claims priority under 35 U.S.C. §119(a) to Korean application number 10-2013-0047250, filed on Apr. 29, 2013, in the Korean Intellectual Property Office, which is incorporated herein by reference in its entirety.

BACKGROUND

1. Technical Field

Various embodiments relate to a semiconductor integrated circuit, and more particularly, to an arrangement structure of transistors constituting a differential amplifier and a method of arranging the transistors.

2. Related Art

In general, a differential amplifier has been applied to various fields of a semiconductor integrated circuit.

For example, a differential amplifier is mainly used in an internal voltage generation circuit which receives an external voltage and converts the received voltage into an internal voltage having a predetermined level. In addition, the differential amplifier is used in various fields such as a data output buffer and a comparator circuit.

Referring to FIG. 1, the differential amplifier 10 may include a first transistor TR1 configured to receive a first input voltage Vin1 and a second transistor TR2 configured to receive a second input voltage Vin2. The drain of the first transistor TR1 and the drain of the second transistor TR2 are electrically coupled to a power supply voltage VDD, and the source of the first transistor TR1 and the source of the second transistor TR2 are electrically coupled to a current source CS coupled to a ground voltage terminal. In FIG. 1, R1 represents a voltage drop resistor coupled between the first transistor TR1 and the power supply voltage terminal, and R2 represents a voltage drop resistor coupled between the second transistor TR2 and the power supply voltage terminal.

The first and second transistors TR1 and TR2 constituting the differential amplifier 10 are required to have the same performance, in order to accurately compare input voltages Vin1 and Vin2. Thus, the transistors TR1 and TR2 must be formed to have the same size and shape. In order to reduce a difference between the first and second transistors TR1 and TR2 when the transistors TR1 and TR2 are integrated in a semiconductor substrate, one transistor may be divided into a plurality of transistors so that the plurality of transistors has a fingered structure (hereinafter, a plurality of segment transistors). The segment transistor of the first transistors TR1 and the segment transistor of the second transistor TR2 may be alternately arranged to compensate for the mismatches between the first and second transistors TR1 and TR2.

Referring to FIG. 2, when the differential amplifier structure is substituted for "a regular stress variation curve for distance change" and then simulated, the stress variations of the first and second transistors TR1 and TR2 are substantially similar to each other.

However, when the transistor TR1 and TR2 is divided into the plurality of segment transistors, a distance between the signal input terminal and a first fingered segment transistor constituting the first or second transistor TR1 or TR2 may be different from a distance between the signal input terminal and the first or second transistor TR1 or TR2 which does not divide into the plurality of fingered segment transistors.

When the transistor structure is substituted for "an irregular stress variation curve for distance change" which is calculated based on such a principle and then simulated as illustrated in FIG. 3, a difference occurs between stress variations of the first and second transistors TR1 and TR2.

Thus, as the transistors of the differential amplifier which must have substantially the same performance exhibit different performances, it is impossible to acquire reliable differential amplification efficiency.

SUMMARY

In an embodiment of the present invention, a semiconductor integrated circuit includes: a transistor region having a first center line to divide the transistor region into a first area and a second area; a plurality of first groups arranged in the first and second area of the transistor region; and a plurality of second groups arranged in the first and second area of the transistor region, wherein the first and second groups are arranged to have a folded symmetry with respect to the first center line of the transistor region, and the plurality of the first groups and the plurality of the second groups include a plurality of first segment transistors constituting a first transistor to receive a first signal, and a plurality of second segment transistors constituting a second transistor to receive a second signal, and arrangements of the first and second segment transistors of the first groups are opposite to those of the second groups.

In an embodiment of the present invention, a semiconductor integrated circuit includes: a transistor region having a center line; a first block arranged in one side of the center line of the transistor region, and comprising a plurality of first and second groups each having a plurality of first and second segment transistors constituting first and second transistors of a differential amplifier; and a second block arranged in the other side of the center line, and having an arrangement corresponding to the arrangement of the first and second groups of the first block.

In an embodiment of the present invention, a semiconductor integrated circuit includes: a transistor region configured with first and second transistors for receiving an input signal and are formed in a differential amplifier; a first group arranged on one side of a center line of the transistor region and comprising a pair of first segment transistors and a pair of second segment transistors seriate arranged between the pair of first segment transistors; and a second group arranged on the other side of the center line of the transistor region and comprising the pair of second segment transistors and the pair of first segment transistors seriate arranged between the pair of second segment transistors.

In an embodiment of the present invention, a method of arranging a semiconductor integrated circuit including a first transistor configured for receiving a first signal, a second transistor configured for receiving a second signal and the second transistor having substantially the same properties as the first transistor, the method including: dividing a transistor region to form the first transistor and the second transistor into a first region and a second region with respect to a first center line which is positioned at a center region thereof; dividing the first and second regions into a first group region and a second group region, respectively, wherein the first and second group regions of the first region are symmetrical to the first and second group regions of the second region with respect to the center line; fingering the first transistor into a plurality of first segment transistors and the second transistor into a plurality of second segment transistors; forming the plurality of first segment transistors and the plurality of second segment transistors in the first group regions of the first and second regions with a first order; and forming the plurality of first segment transistors and the plurality of second segment transistors in the second group region of the first and second regions with a second order, wherein the first order is symmetrically mismatched from the second order.

The forming the first and second segment transistors according to the first order includes: defining a center line of the first group regions; and symmetrically arranging the first and second segment transistors with respect to the center line of the first group regions.

The forming the first and second segment transistors according to the second order includes: defining a center line of the second group regions; and symmetrically arranging the first and second segment transistors with respect to the center line of the second group regions, wherein the first and second segment transistors of the first group region are symmetrically mismatched with the first and second segment transistors of the second group region.

BRIEF DESCRIPTION OF THE DRAWINGS

Features, aspects, and embodiments are described in conjunction with the attached drawings, in which:

FIG. 7 is a plan view illustrating the transistor arrangement of a differential amplifier according to an embodiment of the present invention.

DETAILED DESCRIPTION

Hereinafter, a semiconductor integrated circuit according to the present invention will be described below with reference to the accompanying drawings through exemplary embodiments. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention.

Figure 1:
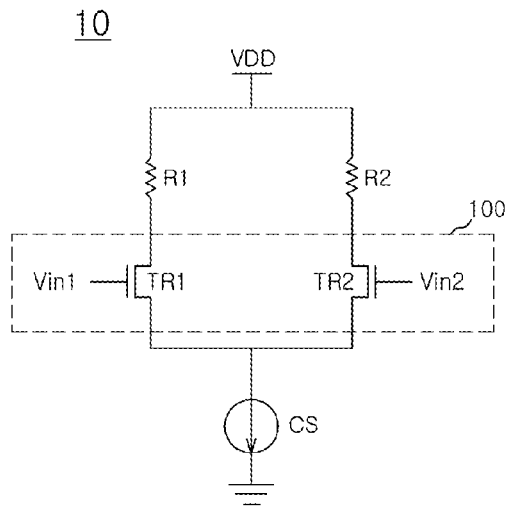
FIG. 1 is a circuit diagram illustrating a conventional differential amplifier structure.
Figure 2:
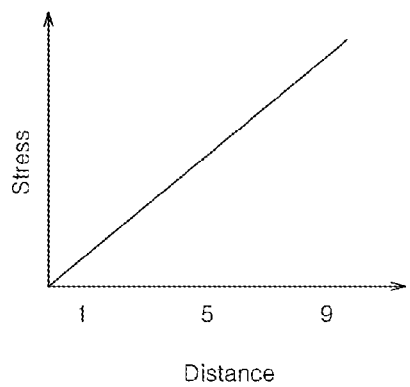
FIG. 2 is a graph illustrating regular stress variations based on distances of the conventional differential amplifier.
Figure 3:
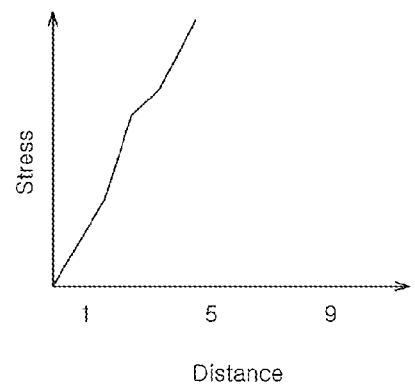
FIG. 3 is a graph illustrating irregular stress variations based on distances of the conventional differential amplifier.

A differential amplifier may include first and second transistors TR1 and TR2 configured to receive a first input voltage Vin1 and a second input voltage Vin2 as shown in FIG. 1. The second input voltage may be a reference voltage.

The first and second transistor TR1 and TR2 may be integrated in a transistor region 100 of a semiconductor substrate (not shown). The first and second transistors TR1 and TR2 may be divided or separated into a plurality of segment transistors, in order to reduce the influence of resistance or the like. In this embodiment, this operation will be referred to as "fingering of the transistor."

Figure 4:
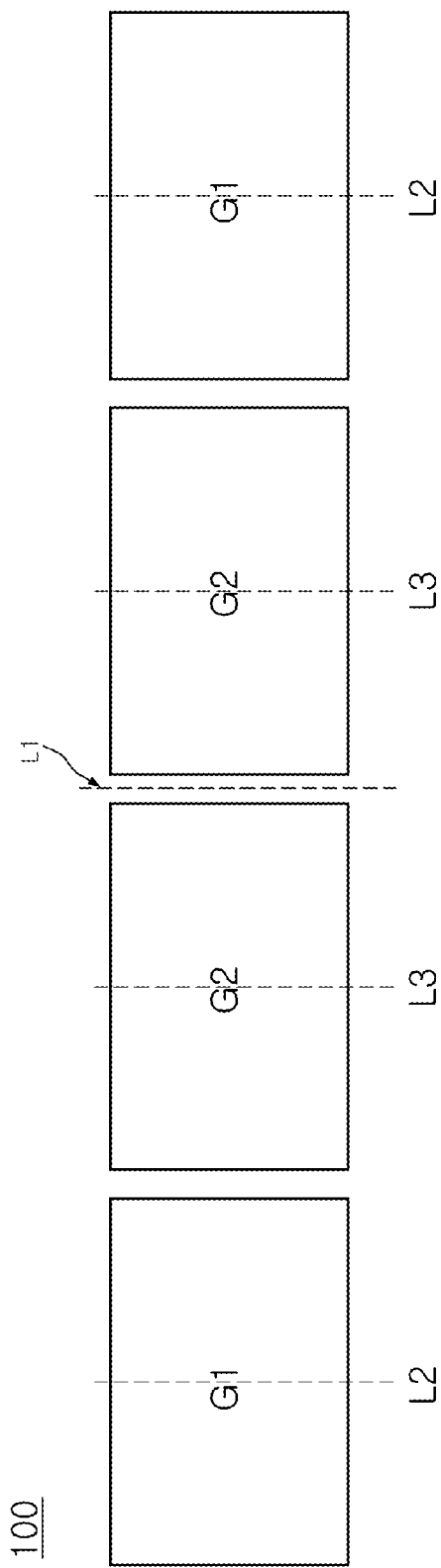
FIG. 4 is a plan view illustrating the transistor arrangement of a differential amplifier according to an embodiment of the present invention.

Referring to FIG. 4, the plurality of segment transistors constituting of the first and second transistor TR1 and TR2 may be classified into a plurality of first groups G1 and a plurality of second groups G2. For example, a pair of first groups G1 and a pair of second groups G2 may be arranged in the transistor region 100 of the differential amplifier, to form the first and second transistor TR1 and TR2. The pair of second groups G2 may be seriate arranged between the pair of first groups G1. That is, the first group G1, the second group G2, the second group G2, and the first group G1 may be arranged from one side (for example, a left side of the FIG. 4) of the transistor region 100 of the differential amplifier, in order. As a result, the transistor region 100 of the differential amplifier may have a structure in which the first group G1 and the second group G2 are arranged to have a folded symmetry with respect to a first center line L1 of the transistor region 100. Thus, one side of the first center line L1 (i.e., the left side) may constitute a first region and the other side of the first center line L1 (i.e., the right side) may constitute a second region. Additionally, for example, the first region may be divided into a first group region where segment transistors constituting a first group G1 will be formed and a second group region where segment transistors constituting a second group G2 will be formed.

first group region including a first group G1, and second group region including a second group G2. for example, the first region may include a first group of transistors located within a substrate region (i.e., G1). Also, for example, the second region may include a second group of transistors located within a substrate region (i.e., G2).

Figure 5:
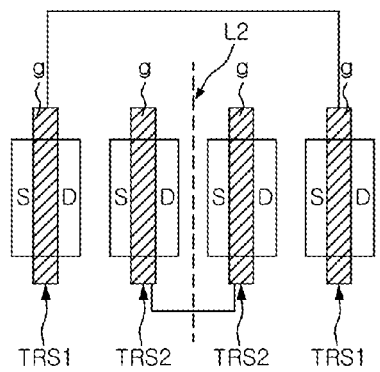
FIG. 5 is a plan view of a group G1 of FIG. 4.

Referring to FIG. 5, the first group G1 may include a plurality of first segment transistors TRS1 fingered from the first transistor TR1 and a plurality of second segment transistors TRS2 fingered from the second transistor TR2. The first group G1 may include a pair of first segment transistors TRS1 and a pair of second segment transistors TRS2, and the pair of second segment transistors TRS2 may be seriate arranged between the pair of first segment transistors TRS1. That is, the first segment transistor TRS1, the second segment transistor TRS2, the second segment transistor TRS2, and the first segment transistor TRS1 may be arranged from one side (for example, left side of the FIG. 5) of the first group G1, in order. As a result, the first group G1 may have a structure in which the first and second segment transistors TRS1 and TRS2 are arranged to have a folded symmetry with respect to a second center line L2 of the first group G1. In FIG. 5, 'g' represents gates of the first and second segment transistors TRS1 and TRS2, 'S' represents sources of the first and second segment transistors TRS1 and TRS2, and 'D' represents drains of the first and second segment transistors TRS1 and TRS2. Further, the gates 'g' of the first segment transistors TRS1 may be electrically connected to each other and the gate 'g' of the second segment transistors TRS2 may be electrically connected with each other.

Figure 6:
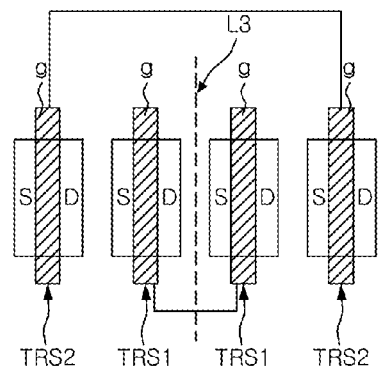
FIG. 6 is a plan view of a group G2 of FIG. 4.

Referring to FIG. 6, the second group G2 may also include a plurality of first segment transistors TRS1 fingered from the first transistor TR1 and a plurality of second segment transistors TRS2 fingered from the second transistor TR2. The second group G2 may include a pair of first segment transistors TRS1 and a pair of second segment transistors TRS2, and the pair of first segment transistors TRS1 may be seriate arranged between the pair of second segment transistors TRS2. That is, the second group G2 may have the opposite shape of the arrangement of the segment transistors in the first group G1. For example, the second segment transistor TRS2, the first segment transistor TRS1, the first segment transistor TRS1, and the second segment transistor TRS2 may be arranged from one side (for example, left side of FIG. 6) of the second group G2, in order. As a result, the second group G2 may have a structure in which the first and second segment transistors TRS1 and TRS2 are arranged to have a folded symmetry with respect to a third center line L3 of the second group G2. Further, the gates 'g' of the first segment transistors TRS1 may be electrically connected with each other and the gate 'g' of the second segment transistors TRS2 may be electrically connected to each other. For example, the second center line L2 may be positioned on one side of the first center line L1 within the first group G1 as shown in FIG. 4 and on the other side of the first center line L1 within the first group G1 as shown in FIG. 4. Also, for example, the third center line L3 may be positioned on one side of the first center line L1 within the second group G2 as shown in FIG. 4 and on the other side of the first center line L1 within the second group G2 as shown in FIG. 4.

The first and second groups G1 and G2 may include the plurality of first and second groups G1 and G2. The first and second groups G1 and G2 may be arranged so as to be symmetrically folded with respect to the first center line L1 of the transistor region 100.

As the groups G1 and G2 are arranged to have a folded symmetry with respect to the first center line L1 of the transistor region 100, mismatch between the first and second segment transistors TRS1 and TRS2 in the groups G1 and G2 may be doubly offset. Therefore, although the distance of the transistor region 100 (for example, the distance between the signal input terminal and a segment transistor which is arranged nearby the signal input terminal) is changed, the stress variations of the first and second segment transistors TRS1 and TRS2 are almost equalized to each other.

Referring to FIG. 7, the transistor region 100 of the differential amplifier may be divided into a first block B1 and a second block B2. The first and second blocks B1 and B2 may include a plurality of first and second groups G1 and G2, respectively.

The first block B1 may include a pair of first groups G1 and a pair of second groups G2. More specifically, the first block B1 is configured in such a manner that the pair of second groups G2 are seriate arranged between the pair of first groups G1. The first and second groups G1 and G2 may have the same structure as the structures of FIGS. 5 and 6. For example, the first block B1 may include a fifth center line L5 which is positioned at the center region thereof. The plurality of first groups G1 and the plurality of second groups G2 are arranged to have a folded symmetry with respect to the fifth center line L5.

The second block B2 may also include a pair of first groups G1 and a pair of second groups G2. The second block B2 may include a sixth center line L6 which is positioned at the center region thereof. The plurality of first groups G1 and second groups G2 may be arranged to have a folded symmetry with respect to the sixth center line L6. Thus the second block B2 may be arranged to be opposite to the arrangement of the first and second groups G1 and G2 of the first block B1. For example, the pair of first groups G1 of the second block B2 may be seriate arranged between the pair of second groups G2 of the second block B2.

As above, the transistor region 100 of the differential amplifier may include the first and second blocks B1 and B2 which are arranged in the left and right sides of a fourth center line L4 of the transistor region 100. Thus, the symmetry mismatch differences between the first transistor TR1 and the second transistor TR2 (for example, the first segment transistor's TRS1 and the second segment transistor's TRS2) may be compensated for by arranging a symmetrical mismatch between the first and second blocks B1 and B2 inside the transistor region 100 with regards to the fourth center line L4 as seen in FIG. 7, by symmetrically mismatching the first and second groups G1 and G2 of the first block B1 with the first and second groups G1 and G2 of the second block B2 with regards to the fourth center line L4, and by arranging a symmetrical mismatch between the first and second segment transistor TRS1 and TRS2 inside each of the first and second groups G1 and G2 as shown in FIGS. 5 and 6. Thus, at a transistor region level (i.e., FIG. 7) the first and second groups G1 and G 2 of block one B1 (i.e., G1, G2, G2, G1 (in this order)) are not symmetrical to the first and second groups G1 and G2 of block two B2 (i.e., G2, G1, G1, G2 (in this order)) with regards to the fourth center line L4. Additionally, at the block level (i.e., FIG. 4) the first group G1 and second group G2 (i.e., G1 and G2 (in this order and to the left of the first center line) are symmetrically matched with the first group G1 and second group G2 (i.e., G2 and G1 (in this order and to the right of the first center line) with regards to the first center line L1. Finally, at the group level (i.e., FIGS. 5 and 6) the first and second segment transistors TRS1 and TRS2 (i.e., TRS1, TRS2, TRS2, TRS1 (in this order)) of the first group G1 are not symmetrically matched (or symmetrically mismatched) with the first and second segment transistors TRS1 and TRS2 (i.e., TRS2, TRS1, TRS1, TRS2 (in this order)) of the second group G2 with regards to a center line between group one G1 and group two G2 (i.e., FIGS. 5 and 6). Thus, the symmetry mismatch differences between the first transistor TR1 and the second transistor TR2 may be compensated for by arranging a symmetrical mismatch at the transistor region level, a symmetrical match at the block level, and a symmetrical mismatch at a group level as shown in FIGS. 4 through 7.

That is, as the first and second blocks B1 and B2 having the first and second groups G1 and G2 which are arranged to correspond opposite to each other are complementarily arranged based on the fourth center line L4, the difference between the segment transistors (i.e., size and shape) may be additionally offset and compensated for.

Experimental Example

Table 1 shows irregular stress variations based on distances in a transistor of the differential amplifier. In this embodiment, the stress indexes of Table 1 may be analyzed into fixed values.

TABLE 1

| | Distance | | | | | | | | | | | | | | | |
|---|---|---|---|---|---|---|---|---|---|---|---|---|---|---|---|---|
| Stress variation | 1 | 4 | 7 | 9 | 11 | 14 | 17 | 19 | 21 | 22 | 24 | 27 | 31 | 34 | 35 | 39 |

When the structure of FIG. 4 is applied to the irregular stress variations, the result may be obtained as shown in Table 2.

TABLE 2

| Stress variations based on distances | | | | | | | | | | | | | | | |
|---|---|---|---|---|---|---|---|---|---|---|---|---|---|---|---|
| G1 | | | | G2 | | | | G2 | | | | G1 | | | |
| TRS1 | TRS2 | TRS2 | TRS1 | TRS2 | TRS1 | TRS1 | TRS2 | TRS2 | TRS1 | TRS1 | TRS2 | TRS1 | TRS2 | TRS2 | TRS1 |
| 1 | 4 | 7 | 9 | 11 | 14 | 17 | 19 | 21 | 22 | 24 | 27 | 31 | 34 | 35 | 39 |

TR1(all of TRS1) = 1 + 9 + 14 + 17 + 22 + 24 + 31 + 39 = 157
TR2(all of TRS2) = 4 + 7 + 11 + 19 + 21 + 27 + 34 + 35 = 158

According to Table 2, when the transistors of the differential amplifier are fingered into a plurality of transistors and then arranged as described in this embodiment, the sum of stresses of the first transistors TR1 becomes nearly equal to the sum of stresses of the second transistors TR2.

According to the embodiment of the present invention, the input transistors constituting the differential amplifier are fingered into a plurality of transistors, and the plurality of fingered transistors are arranged to have a folded symmetry with respect to the center line of each unit region (group and block). Thus, the mismatches between the transistors are offset.

According to the above-described arrangement, although the first segment transistors fingered into the plurality of transistors and the second segment transistors fingered into the plurality of transistors are arranged at different distances from the signal input terminal, the sum of irregular stresses of the first segment transistors are substantially equal to the sum of irregular stresses of the second segment transistors. Thus, it is possible to improve the efficiency of the differential amplifier.

While certain embodiments have been described above, it will be understood to those skilled in the art that the embodiments described are by way of example only. Accordingly, the semiconductor integrated circuit described herein should not be limited based on the described embodiments. Rather, the semiconductor integrated circuit described herein should only be limited in light of the claims that follow when taken in conjunction with the above description and accompanying drawings.

What is claimed is:

1. A method of arranging a semiconductor integrated circuit including a first transistor configured for receiving a first signal, a second transistor configured for receiving a second signal and the second transistor having substantially the same properties as the first transistor, the method comprising:
   dividing a transistor region to form the first transistor and the second transistor into a first region and a second region with respect to a first center line which is positioned at a center region thereof;
   dividing the first and second regions into a first group region and a second group region, respectively, wherein the first and second group regions of the first region are symmetrical to the first and second group regions of the second region with respect to the center line;
   fingering the first transistor into a plurality of first segment transistors and the second transistor into a plurality of second segment transistors;
   forming the plurality of first segment transistors and the plurality of second segment transistors in the first group regions of the first and second regions with a first order; and
   forming the plurality of first segment transistors and the plurality of second segment transistors in the second group region of the first and second regions with a second order,
   wherein the first order is symmetrically mismatched from the second order.

2. The method of claim 1, wherein integrating the first and second segment transistors according to the first order comprises:
   defining a center line of the first group regions; and
   symmetrically arranging the first and second segment transistors with respect to the center line of the first group regions.

3. The method of claim 2, wherein integrating the first and second segment transistors according to the second order comprises:
   defining a center line of the second group regions; and
   symmetrically arranging the first and second segment transistors with respect to the center line of the second group regions,
   wherein the first and second segment transistors of the first group region are symmetrically mismatched with the first and second segment transistors of the second group region.

* * * * *